INVENTORS
Kiichi Komatsubara
Hirokazu Kurono
BY: Paul M. Craig, Jr.
ATTORNEY

INVENTORS
Kiichi Komatsubara
HiroKazu Kurono
BY: Paul M. Craig, Jr.
ATTORNEY

INVENTORS
KIICHI KOMATSUBARA
HIROKAZU KURONO

BY Paul M. Craig, Jr.
ATTORNEY

United States Patent Office 3,310,502

Patented Mar. 21, 1967

3,310,502

SEMICONDUCTOR COMPOSITION WITH NEGATIVE RESISTANCE CHARACTERISTICS AT EXTREME LOW TEMPERATURES

Kiichi Komatsubara and Hirokazu Kurono, both of Tokyo, Japan, assignors to Hitachi, Ltd., Tokyo, Japan Filed June 29, 1965, Ser. No. 472,388

Claims priority, application Japan, Mar. 24, 1962, 37/11,820

5 Claims. (Cl. 252—512)

This application is a continuation-in-part of our copending application Ser. No. 266,289, filed Mar. 19, 1963, now abandoned.

The present invention relates to semiconductors and semiconductor devices having sharp negative resistance characteristics at extremely low temperatures, which are particularly suitable for switching purposes, and is intended to provide an improved semiconductor of the character described.

According to the present invention, a semiconductor with negative resistance characteristics at extremely low temperatures comprises a semiconductor having a deep level formed therein.

According also to the present invention, a semiconductor of the character described comprises a semiconductor doped with a heavy metal element to form deep levels therein, in addition to acceptor and donor impurities.

According further to the present invention, a semiconductor of the character described comprises a semiconductor base doped with acceptor and donor impurities and having lattice defects, such as dislocations, interstitial atoms or atom vacancies, to form deep levels therein.

The present invention will now be described in more detail with reference to the accompanying drawings, in which.

Figure 6:
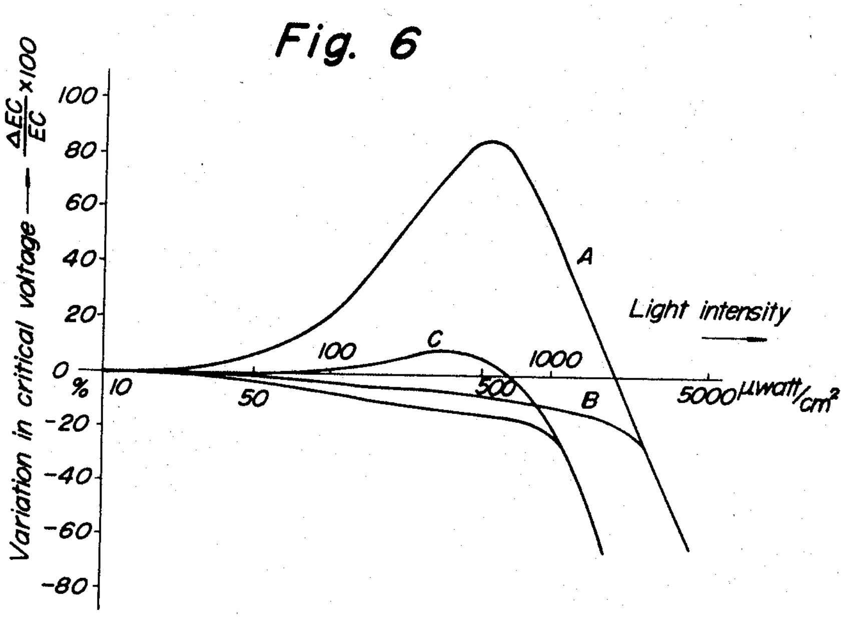
Figure 7:
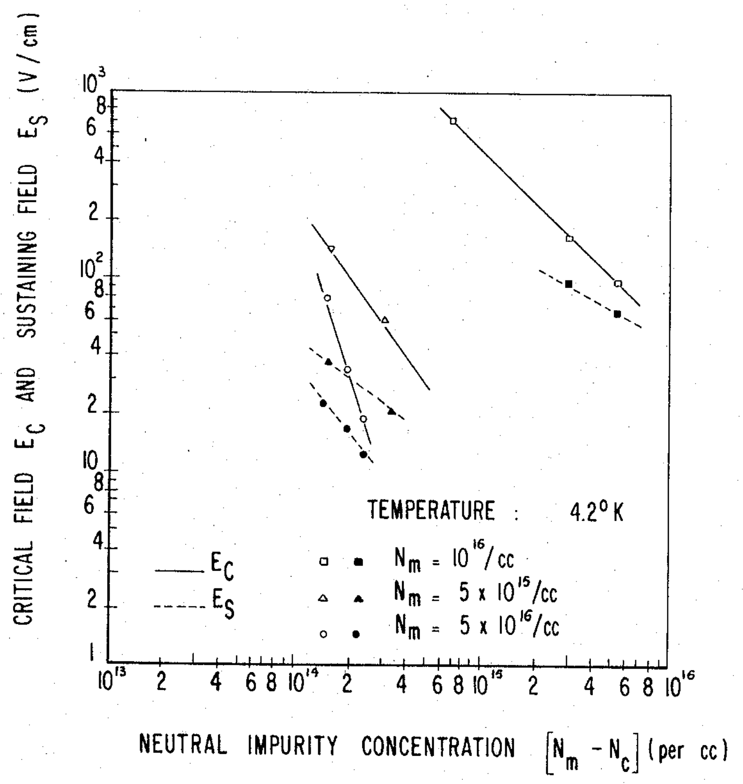

FIGURES *5a* and *5b* are enlarged perspective views of two different forms of the semiconductor device of the present invention, respectively;

FIGURE 6 is a graphical illustration of the relationship between the light intensity and the variation in the critical electric field strength, which causes an electrical breakdown in conventional semiconductor devices, and the same relationship with the semiconductor of the present invention when subjected to light radiation; and FIGURE 7 is a graph showing the dependence of the critical field $E_c$ and the sustaining field $E_s$ on the neutral impurity concentration in the semiconductor of the present invention.

Figure 1:
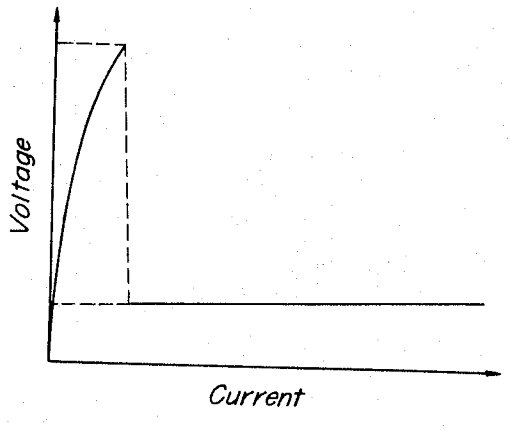
FIGURE 1 illustrates the static characteristics of a previously known semiconductor device having negative resistance characteristics at extremely low temperatures.
Figure 2:
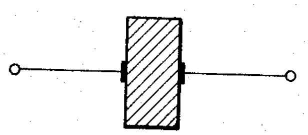
FIGURE 2 is a schematic sectional view of the semiconductor device of the present invention.

It is known that the breakover voltage or critical field $E_c$ of a conventional semiconductor device is reduced when such a device is irradiated with light. Also, with a so-called cryosar as illustrated in FIGURE 2, which is a negative resistance semiconductor device usable at extremely low temperatures, the critical field $E_c$ corresponding to the breakover voltage referred to above is reduced with an increase in the light intensity, as illustrated by curve D in FIGURE 6.

The reason for such a reduction of the critical field $E_c$ in the case of a conventional cryosar has not been fully clarified up till now, but this phenomenon may perhaps be explained as follows hereinbelow.

By way of a example, description will now be made in connection with a single crystal of n-type semiconductor material.

Figure 3:
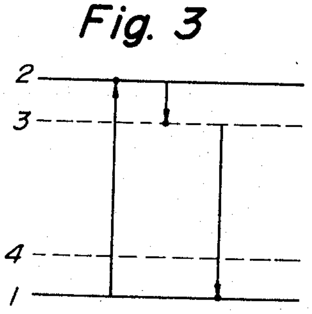
FIGURE 3 is a well known schematic diagram illustrating the impurity levels in the energy band structure of a semiconductor.

Referring to the energy level diagram of FIGURE 3, which shows a valence band 1, a conduction band 2, donor level 3 and acceptor level 4, some of the electrons excited from the valence band 1 to the conduction band 2 by light radiation fall into the donor level 3 to increase the electron density $n_d$ of the level 3, while those electrons remaining in the conduction band 2 also increase the electron density therein since they have a substantial lifetime of remaining in the conduction band. The critical field strength varies depending upon whether the electron density $n_c$ of the conduction band 2 is higher or lower than the electron density $n_d$ of the donor level 3. Accordingly, with the negative resistance semiconductor devices of the prior art, the critical field $E_c$ has generally been reduced by light radiation as the relationship $n_c > n_d$ is established by such radiation.

The present invention provides a negative resistance semiconductor usable at extremely low temperatures such as, for example, the temperature of liquid nitrogen (about 77° K.) or liquid helium (about 4° K.) and lower, the critical field strength of which is not reduced by light radiation but, rather, is raised as long as the light radiation has an appropriate intensity.

Like conventional semiconductors of the kind described, the semiconductor of the present invention has negative resistance characteristics which are obtainable by the use of a single crystal semiconductor material, such as germanium or silicon, with acceptor and donor impurities added to the semiconductor material in proper amounts to give substantially the same concentration thereof with respect to each other. In other words, the semiconductor material is doped with suitable amounts of acceptor and donor impurities such that they are effectively compensated for by each other, as is conventional in the art. Shallow impurities of the p-type (acceptor) which may be employed include Group III elements such as indium, boron, aluminum, and gallium. Shallow impurities of the n-type (donor) which may be employed include Group V elements such as phosphorus, antimony, and arsenic. The total concentration of impurity in the semiconductor of the present invention may range from $10^{14}$ atoms/cc. to $10^{16}$ atoms/cc. The compensation of the acceptor and donor impurities may range from 50 to 90%, i.e., in the case of a p-type impurity, $$\frac{N_D(\text{concentration of donor})}{N_A(\text{concentration of acceptor})}=K=50\text{–}90\%$$

and, in the case of an n-type impurity, the compensation is the same, $$\frac{N_A}{N_D}=K=50\text{–}90\%$$

Figure 4:
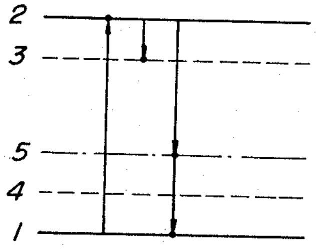
FIGURE 4 illustrates the impurity level diagram of the semiconductor used in a device embodying the present invention.

Referring to FIGURE 4, some of the electrons excited from the valence band 1 to the conduction band 2 will fall to the donor level 3 to increase the electron density therein, as described hereinbefore. In this case, however, as an important feature of the present invention, a deep level 5 is formed between the donor level 3 and the acceptor level 4. Therefore, the remaining electrons excited to the conduction band 2 will immediately fall therefrom through the deep level 5 into the valence band 1 to recombine with the holes previously formed therein. The electrons falling first to the donor level 3 will stay in this level longer before recombination with holes due to the nature of the donor level then the electrons recombining with holes through the deep level, that is, they have a longer lifetime than the electrons in the conduction band 2.

Consequently, as the light intensity increases, the electron density $n_d$ in the donor level 3 will exceed the electron density $n_c$ in the conduction band 2, so as to increase the critical field $E_c$.

The feature that the critical field $E_c$ increases with an increase in the light radiation is entirely novel and has been realized for the first time only by the present invention.

The following examples are given merely as illustrative of the present invention and are not to be considered as limiting.

*Example I*

Figure 5A:
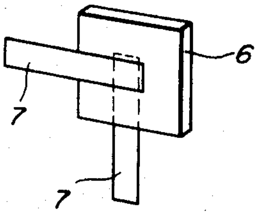

To obtain acceptor and donor impurities in a single crystal silicon in mutually compensating amounts appropriate to give proper negative resistance characteristics, $1.2\times10^{14}$ atoms/cc. of boron and $0.96\times10^{14}$ atoms/cc. of phosphorous were added to the silicon semiconductor material. At the same time, a specific substance for forming a deep level, for example, zinc, was added thereto, in accordance with the present invention, as a further doping material in an amount that the deep level has a density of approximately $5\times10^{13}$ atoms/cc. to form a p-type silicon semiconductor material. The semiconductor material was sliced to form a rectangular (semiconductor) wafer 6 (FIGURE 5*a*) having dimensions of about 120 m$\mu$ x 2 mm. x 2 mm. Electrodes in the form of gold wires 7, 7' containing gallium and having a thickness of 50 m$\mu$ and a width of 0.5 mm. were secured by ultrasonic welding to the opposite sides of the wafer to form low-resistive ohmic contacts. The semiconductor element obtained in this manner was put into operation under light radiation at the extremely low temperature of liquid helium (4° K.). The variation in the critical field $E_c$ was measured for various light intensity values to obtain a unique characteristic curve A (FIGURE 6) as contrasted with curve B obtained with a conventional silicon cryosar. As observed, the curve A has a peak point at a light intensity value of 600 m$\mu$ watts/cm.$^2$, representing an 85% rise in the critical field strength as based upon the critical field $E_{co}$ obtained with no light radiation.

*Example II*

Figure 5B:
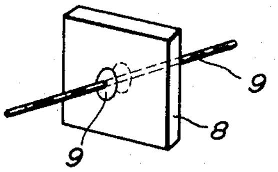

To obtain a single crystal of germanium of the conduction type, $5\times10^{14}$ atoms/cc. of indium and $4\times10^{14}$ atoms/cc. of antimony were added to germanium material. At the same time, zinc was added to form a deep level having a density of zinc atoms of approximately $7\times10^{13}$/cc. The p-type semiconductor base material of germanium obtained in this manner was sliced to form a rectangular semiconductor wafer 8 (FIGURE 5*b*) having dimensions of approximately 0.8 mm. x 2 mm. x 2 mm. Electrodes 9 and 9' were formed on the semiconductor wafer 8 by alloying indium grains of 0.4 mm. diameter to the opposite sides thereof. The semiconductor element thus obtained was put into operation under light radiation at the extremely low temperature of liquid helium. The variation in critical field strength was measured at various light intensity values to obtain a characteristic curve C (FIGURE 6) as contrasted with curve D obtained with a conventional germanium cryosar. As observed from curve C, the critical field $E_c$ was raised for a substantial range of light intensity.

Similar type resistance characteristics are also obtained with the semiconductors described in Examples I and II throughout the range of temperature from that of liquid nitrogen (77° K.) to down near absolute zero.

As illustrated in the above examples, the critical field $E_c$ is increased or decreased depending upon the intensity of light radiation on the semi-conductor element. Such variation in critical field strength largely depends upon the proportion of the impurity material added to form a deep level, and it has been found that the critical field may be increased even to more than twice as high as its initial value.

Also, a low power operation is easily obtainable with the semiconductor of the present invention. It shows very sharp voltage-current characteristic, i.e., a very small curent $I_c$ (10–100$\mu$ or below) at the peak point thereof, and a very low voltage $E_c$ (below 100 v./cm.) at that point, as can be seen from FIGURE 7.

Although zinc was used as the impurity material to form the deep level in the semiconductor crystal in the above examples, other heavy metals such as copper, silver, gold, iron, cobalt, nickel, and magnesium may also be used in the place of zinc. The concentration of such heavy metals may range from $5\times10^{13}$ atoms/cc. to $7\times10^{15}$ atoms/cc. The effect of the deep level obtained by means of the present invention becomes unobservable below a concentration of $5\times10^{13}$ atoms/cc., and, in some cases, the conversion n→p or p→n of conductivity type takes place at a concentration of over $7\times10^{15}$ atoms/cc. of heavy metal.

It should also be noted that a deep level may be formed in the semiconductor crystal by introducing therein lattice defects, such as dislocations, interstitial atoms or atom vacancies, by gamma-ray or beta-ray irradiation or by mechanical deformation such as distortion (stress).

Generally, it is desirable that the connection of electrodes to the semiconductor wafer be made to form low-resistive ohmic contacts. It is noted, however, that the negative resistance semiconductor of the present invention can operate satisfactorily as a two-terminal negative resistance device even if the electrode connection is such that it exhibits somewhat non-ohmic characteristics, as long as it is used at the extremely low temperatures specified herein.

It should also be appreciated that devices employing the semiconductor of the present invention may be utilized to form a matrix type unit which is highly sensitive to variation in the intensity of light radiation despite its limited size and hence is usable as a memory element in a digital computer, a gate circuit in an automatic control system or other like electrical components.

The invention being thus described, it will be obvious that the same may be varied in many ways. Such variations are not to be regarded as a departure from the spirit and scope of the invention and all such modifications are intended to be included within the scope of the following claims.

We claim:

1. A semiconductor having negative resistance characteristics at extremely low temperatures of 77° K. and below, which consists essentially of a semiconductor material selected from the group consisting of germanium and silicon doped with a heavy metal selected from the group consisting of copper, silver, gold, iron, cobalt, nickel, zinc and magnesium in the amount of $5\times10^{13}$ atoms/cc. to $7\times10^{15}$ atoms/cc., said doping thereby forming a deep level in said semiconductor, shallow acceptor impurities selected from the group consisting of indium, boron, aluminum and gallium and shallow donor impurities selected from the group consisting of phosphorus, antimony and arsenic, said shallow acceptor and donor impurities being present in mutually compensating amounts of about 50 to 90% with respect to each other and the total concentration of said impurities being from about $10^{14}$ atoms/cc. to $10^{16}$ atoms/cc.

2. A semiconductor having negative resistance characteristics at extremely low temperatures of 77° K. and below, which consists essentially of silicon doped with zinc in the amount of $5\times10^{13}$ atoms/cc. to $7\times10^{15}$ atoms/cc., said doping thereby forming a deep level in said semiconductor, and mutually compensating amounts of about 50 to 90% with respect to each other of shallow acceptor and donor impurities, the total amount of said shallow impurities being $10^{14}$ atoms/cc. to $10^{16}$ atoms/cc., said acceptor impurities being selected from the group consisting of indium, boron, aluminum and gallium and said donor impurities being selected from the group consisting of phosphorus, antimony and arsenic.

3. A semiconductor having negative resistance characteristics at extremely low temperatures of 77° K. and below, which consists essentially of germanium doped with zinc in the amount of $5\times10^{13}$ atoms/cc. to $7\times10^{15}$ atoms/cc., said doping thereby forming a deep level in said semiconductor, and mutually compensating amounts of about 50 to 90% with respect to each other of shallow acceptor and donor impurities, the total amount of said impurities being $10^{14}$ atoms/cc. to $10^{16}$ atoms/cc., said acceptor impurities being selected from the group consisting of indium, boron, aluminum and gallium and said donor impurities being selected from the group consisting of phosphorus, antimony and arsenic.

4. A semiconductor having negative resistance characteristics at extremely low temperatures of 77° K. and below, which consists essentially of a semiconductor material selected from the group consisting of germanium and silicon doped with shallow acceptor impurities selected from the group consisting of indium, boron, aluminum and gallium and shallow donor impurities selected from the group consisting of phosphorus, antimony and arsenic, said shallow acceptor and donor impurities being present in mutually compensating amounts of about 50 to 90% with respect to each other and the total concentration of said impurities being from about $10^{14}$ atoms/cc. to $10^{16}$ atoms/cc., and said semiconductor containing atom vacancies therein which are formed by gamma-ray irradiation of said semiconductor.

5. A semiconductor having negative resistance characteristics at extremely low temperatures of 77° K. and below, which consists essentially of a semiconductor material selected from the group consisting of germanium and silicon doped with shallow acceptor impurities selected from the group consisting of indium, boron, aluminum and gallium and shallow donor impurities selected from the group consisting of phosphorus, antimony and arsenic, said shallow acceptor and donor impurities being present in mutually compensating amounts of about 50 to 90% with respect to each other and the total concentration of said impurities being from about $10^{14}$ atoms/cc. to $10^{16}$ atoms/cc., and said semiconductor containing dislocations therein which are formed by mechanical deformation of said semiconductor.

References Cited by the Examiner

UNITED STATES PATENTS

| | | | |
|---|---|---|---|
| 3,108,914 | 10/1963 | Hoerni | 148—186 |
| 3,109,760 | 11/1963 | Goetzberger | 148—186 |

OTHER REFERENCES

J. Physics and Chemistry of Solids, Pergamon Press (1962), vol. 23, pp. 297–309.

LEON D. ROSDOL, *Primary Examiner.*

ALBERT T. MEYERS, *Examiner.*

J. D. WELSH, *Assistant Examiner.*